(12) United States Patent
Chen et al.

(10) Patent No.: US 11,085,709 B2
(45) Date of Patent: Aug. 10, 2021

(54) HEAT EXCHANGE DEVICE FOR CLOSED ELECTRICAL APPARATUS

(75) Inventors: Lee-Long Chen, Taoyuan Hsien (TW); Chien-Hsiung Huang, Taoyuan Hsien (TW); Ya-Sen Tu, Taoyuan Hsien (TW); Zse-Hsin Wang, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 1961 days.

(21) Appl. No.: 13/025,690

(22) Filed: Feb. 11, 2011

(65) Prior Publication Data

US 2011/0198061 A1 Aug. 18, 2011

(30) Foreign Application Priority Data

Feb. 12, 2010 (TW) .................................. 99104525

(51) Int. Cl.
*H05K 7/20* (2006.01)
*F28F 7/02* (2006.01)
*F28D 9/00* (2006.01)

(52) U.S. Cl.
CPC .............. *F28F 7/02* (2013.01); *H05K 7/206* (2013.01); *F28D 9/0037* (2013.01)

(58) Field of Classification Search
CPC ...... H05K 7/206; F24F 12/006; F28D 9/0025; F28D 9/0037; F28D 9/005; F28D 9/0062; F28F 7/02
USPC .............................................. 165/104.34, 54
See application file for complete search history.

(56) References Cited

U.S. PATENT DOCUMENTS

| | | | | |
|---|---|---|---|---|
| 1,825,498 A | * | 9/1931 | Wogan | .......................... 165/157 |
| 4,384,611 A | * | 5/1983 | Fung | ..................... F28D 9/0025 |
| | | | | 165/166 |
| 4,386,651 A | * | 6/1983 | Reinhard | ............... H05K 7/206 |
| | | | | 165/104.33 |
| 4,582,130 A | * | 4/1986 | Modschiedler | ....... F28D 9/0025 |
| | | | | 165/104.33 |
| 4,616,695 A | * | 10/1986 | Takahashi | ............. F28D 9/0068 |
| | | | | 165/54 |
| 6,401,802 B2 | * | 6/2002 | Cottingham | .......... F24F 12/006 |
| | | | | 165/127 |

(Continued)

FOREIGN PATENT DOCUMENTS

CN 201387104 Y 1/2010
CN 102076202 A 5/2011
(Continued)

OTHER PUBLICATIONS

KR 20030032383 A, Machine translation, retrieved Mar. 24, 2016.*
(Continued)

*Primary Examiner* — Eric S Ruppert
*Assistant Examiner* — Hans R Weiland
(74) *Attorney, Agent, or Firm* — Muncy, Geissler, Olds & Lowe, P.C.

(57) ABSTRACT

A heat exchange unit is disclosed. At least one air opening of the heat exchange unit is formed from a sloped surface, enabling the area of the air opening to exceed the cross-sectional area of heat exchange of the heat exchange unit, and further enhancing heat exchange efficiency. A heat exchange device employing the heat exchange unit and a closed electrical apparatus employing the heat exchange device are also disclosed.

9 Claims, 14 Drawing Sheets

(56) References Cited

U.S. PATENT DOCUMENTS

| | | | |
|---|---|---|---|
| 6,789,612 B1 * | 9/2004 | Okamoto | H05K 7/206 165/104.33 |
| 6,889,752 B2 * | 5/2005 | Stoller | 165/47 |
| 7,013,950 B2 * | 3/2006 | Steneby | F24F 12/006 165/11.1 |
| 2002/0134544 A1 * | 9/2002 | DeVilbiss | H05K 7/206 165/287 |
| 2006/0144070 A1 * | 7/2006 | Perthold | H05K 7/206 62/276 |

FOREIGN PATENT DOCUMENTS

| | | | | |
|---|---|---|---|---|
| DE | 10249511 B4 * | 1/2005 | | H05K 7/206 |
| KR | 20030032383 A * | 4/2003 | | |

OTHER PUBLICATIONS

Office Action dated Sep. 1, 2014 in corresponding CN Application 201010122341.8.
Office Action dated Mar. 26, 2015 in corresponding CN Application 201010122341.8.
Office Action dated Mar. 24, 2016 in corresponding CN Application 201010122341.8.
Office Action dated Nov. 11, 2015 in corresponding CN Application 201010122341.8.

* cited by examiner

HEAT EXCHANGE DEVICE FOR CLOSED ELECTRICAL APPARATUS

CROSS REFERENCE TO RELATED APPLICATIONS

This Application claims priority of Taiwan Patent Application No. 99104525, filed on Feb. 12, 2010, the entirety of which is incorporated by reference herein.

BACKGROUND OF THE INVENTION

Field of the Invention

The invention relates to a heat exchange device and a heat exchange unit thereof.

Description of the Related Art

An electronic product, with rapid development of high performance, often generates massive amounts of heat. Thus, heat dissipation of the electronic product has become an important issue. In a closed electrical apparatus, a heat exchanger is often used to dissipate heat generated in the closed electrical apparatus.

FIG. 1A is a schematic exploded view of a conventional heat exchanger 1. FIG. 1B is a cross-sectional side view of the conventional heat exchanger 1. As shown in FIGS. 1A and 1B, the heat exchanger 1 is disposed in a closed electrical apparatus and includes an inward circulation fan 11, an outward circulation fan 12, a heat exchange unit 13, a housing 14, and a cover 15. The heat exchange unit 13 is disposed in the housing 14 and sealed by the cover 15. The inward and outward circulation fans 11, 12 are disposed on a top side and a bottom side of the heat exchange unit 13, respectively. When the inward circulation fan 11 is operated, internal hot air of the closed electrical apparatus is guided into the housing 14 along a direction $I_1$. In another aspect, when the outward circulation fan 12 is operated, external cold air is guided into the housing 14 along a direction $O_2$. When the internal hot air and external cold air enter the heat exchange unit 13 disposed in the housing 14, heat exchange is performed on passage walls of the heat exchange unit 13. Specifically, the internal hot air guided into the housing 14 along the direction $I_1$ is turned into the cold air by heat exchange of the heat exchange unit 13. The cold air then returns to the interior of the closed electrical apparatus along the direction $I_2$. In another aspect, the external cold air guided into the housing 14 along the direction $O_2$ is turned into the hot air by the heat exchange of the heat exchange unit 13. The hot air is then guided to the exterior of the closed electrical apparatus along the direction $O_1$. Accordingly, by the heat exchange of the heat exchange unit 13, a heat-dissipation effect can be provided for the closed electrical apparatus.

Nevertheless, when the size of the closed electrical apparatus is reduced, the size of the heat exchanger 1 is reduced as well, thereby adversely affecting the heat-dissipation effect provided by the heat exchange unit 13. Furthermore, as an air inlet and an air outlet of the housing 14 are almost perpendicular to those of the heat exchange unit 13, only centrifugal fans can be used as the inward and outward circulation fans 11, 12. Here, in addition to providing a less airflow amount, the centrifugal fans are provided with a loud noise.

BRIEF SUMMARY OF THE INVENTION

A detailed description is given in the following embodiments with reference to the accompanying drawings.

To solve the aforementioned problems, a heat exchange device and a heat exchange unit thereof are provided. The heat exchange device includes a housing in which the heat exchange unit is disposed. The heat exchange unit includes a first air opening, a second air opening, a third air opening, and a fourth air opening. The first and second air openings form a first passage. The third and fourth air openings form a second passage. The first and second passages are alternately arranged and are separated from each other by at least one heat-dissipation plate.

In an exemplary embodiment, at least one opening of the heat exchange unit is formed from a sloped surface, enabling the area of the at least one air opening larger than the cross-sectional area of the corresponding passage.

In an exemplary embodiment, an opening at one end of the heat exchange unit is divided into at least two sub-openings located on different levels.

The heat exchange device further includes an inward circulation fan and an outward circulation fan. The inward and outward circulation fans are disposed at the first air opening and third air opening, respectively, for controlling airflow directions in the first and second passages. The first and third air openings are not limited to being air inlets or air outlets.

The first and second passages are alternately arranged and are not connected to each other. The first and second passages are separated from each other by at least one heat-dissipation plate.

As at least one air opening of the present heat exchange unit is formed from a sloped surface, inward circulation fans or outward circulation fans with a large size can be employed in the heat exchange unit. The inward circulation fans or outward circulation fans may be axial fans provided with high power.

By applying the aforementioned heat exchange device to a closed electrical apparatus, waste heat can be removed from the closed electrical apparatus via the heat exchange device and does not convect with air in the exterior of the closed electrical apparatus.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
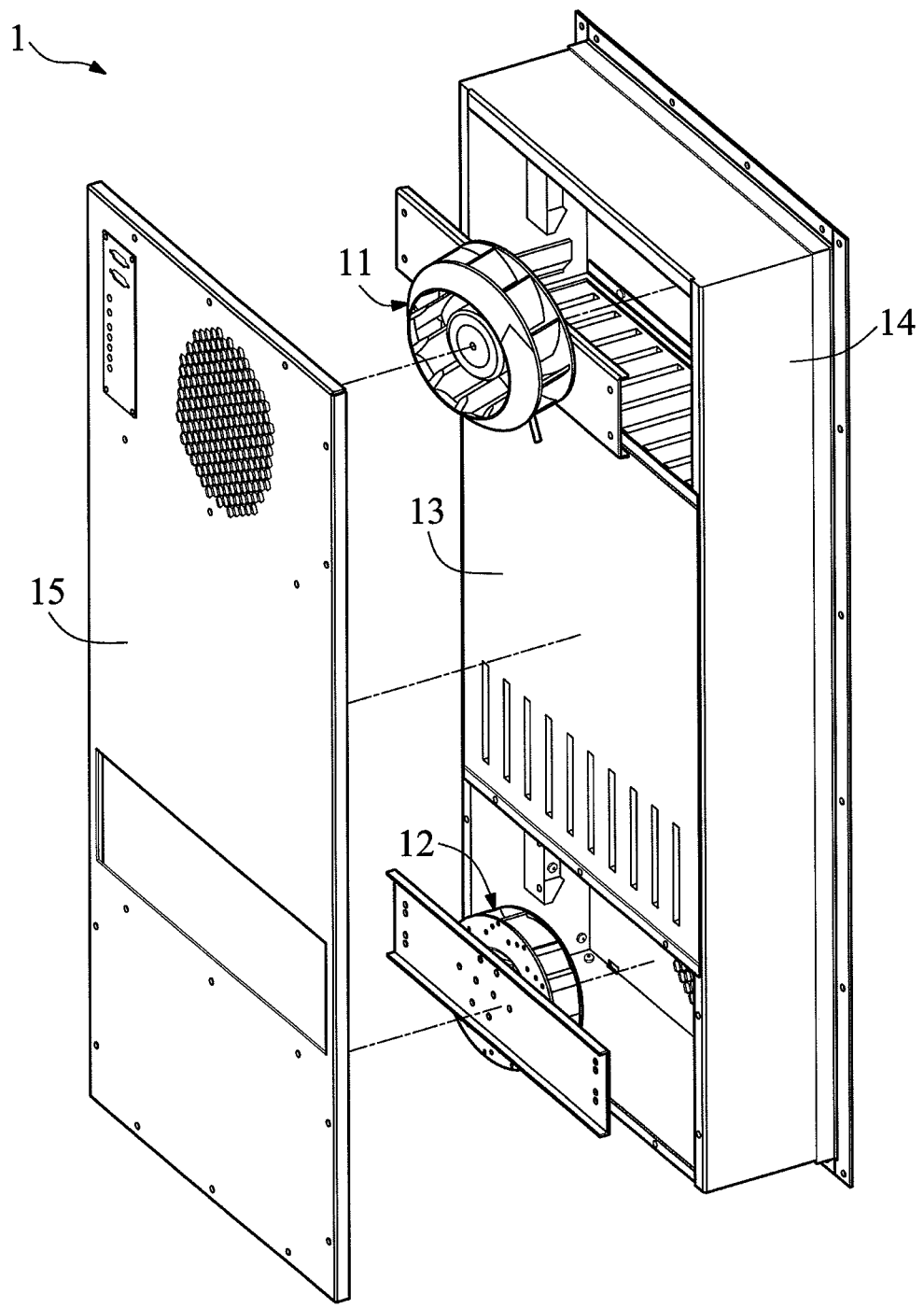
FIG. 1A is a schematic exploded view of a conventional heat exchanger.
Figure 1B:
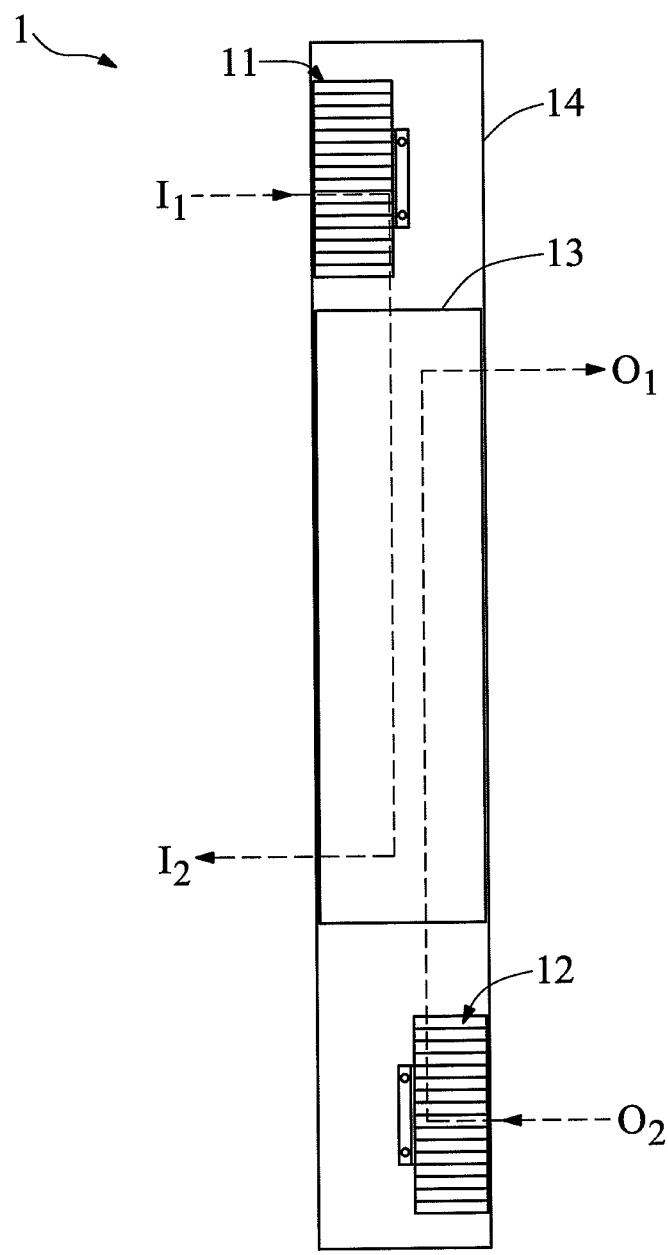
FIG. 1B is a cross-sectional side view of the conventional heat exchanger shown in FIG. 1A.

The following description is of the best-contemplated mode of carrying out the invention. This description is made for the purpose of illustrating the general principles of the invention and should not be taken in a limiting sense. The scope of the invention is best determined by reference to the appended claims.

The following description is directed to explanation of a closed electrical apparatus, a heat exchange device, and a heat exchange unit of a first embodiment of the invention, wherein the same elements share the same reference numerals.

Figure 2:
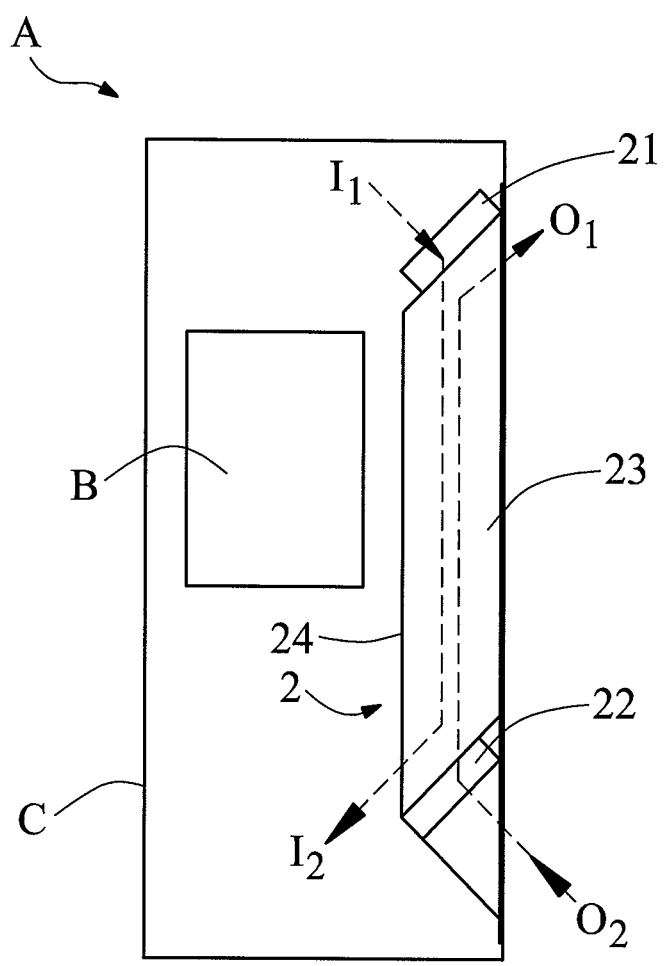
FIG. 2 is a cross-sectional side view of a heat exchange device, of a first embodiment of the invention, employed in a closed electrical apparatus.

FIG. 2 is a cross-sectional side view of a heat exchange device 2, of a first embodiment of the invention, employed in a closed electrical apparatus A. The closed electrical apparatus A may be a server or a large electric appliances. The closed electrical apparatus A includes an electronic assembly B and a casing C. The electronic assembly B is disposed in the casing C and generates heat during operation. In this embodiment, the heat exchange device 2 includes an inward circulation fan 21, an outward circulation fan 22, a heat exchange unit 23, and a housing 24. The heat generated by operation of the electronic assembly B is exchanged to the exterior of the casing C by the heat exchange device 2, and air convection does not occur in the interior and exterior of the closed electrical apparatus. At least a part of the heat exchange device 2 is disposed in the casing C or is attached to the outside of the casing C. Alternatively, one part of the heat exchange device 2 is disposed in the casing C and the other part thereof is exposed from the casing C. In this embodiment, the heat exchange device 2 is completely disposed in the casing C and the invention is not limited thereto.

Figure 3A:
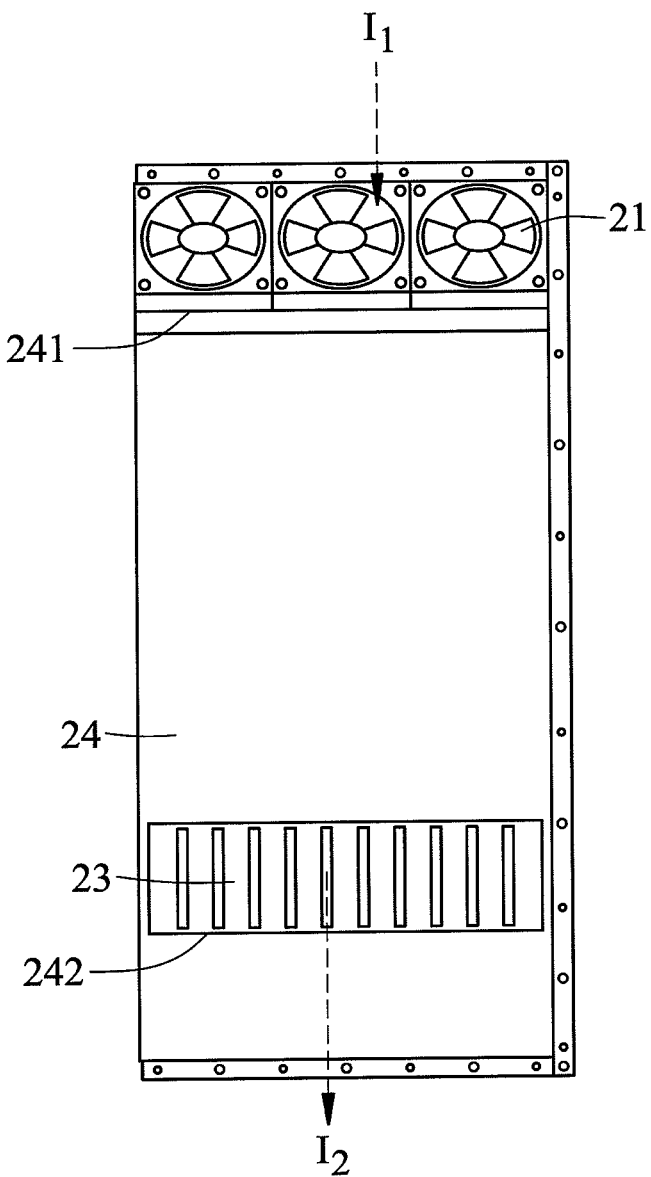
FIG. 3A is a schematic front view of the heat exchange device of the first embodiment of the invention.
Figure 3B:
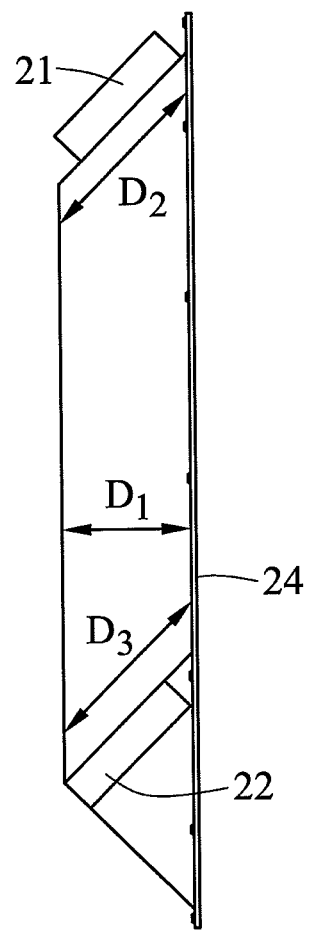
FIG. 3B is a schematic side view of the heat exchange device of the first embodiment of the invention.
Figure 3C:
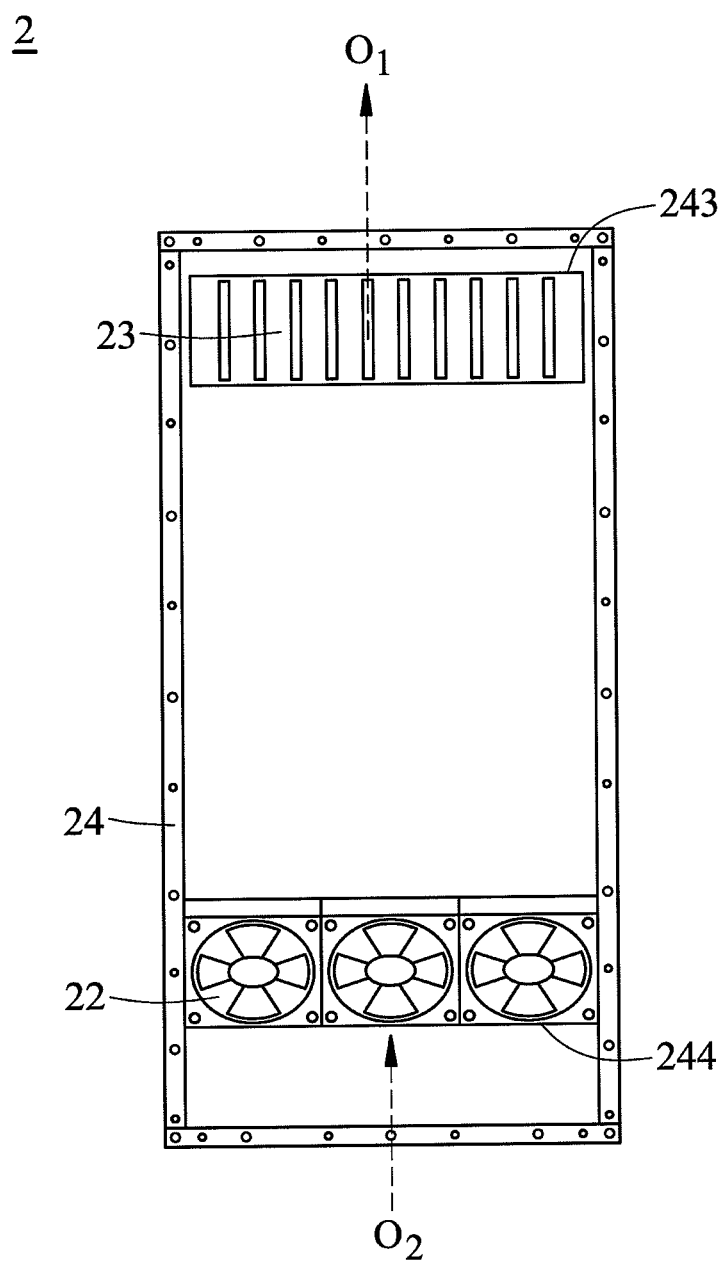
FIG. 3C is a schematic rear view of the heat exchange device of the first embodiment of the invention.

FIGS. 3A, 3B, and 3C are respectively the front, side, and rear views of the heat exchange device 2 of the first embodiment of the invention. As shown in FIGS. 2, 3A, 3B, and 3C, the housing 24 includes an inward circulation air inlet 241 and an inward circulation air outlet 242, both facing the inside of the casing C, and an outward circulation air outlet 243 and an outward circulation air inlet 244, both facing the outside of the casing C. The heat exchange unit 23 is disposed in the housing 24. The heat exchange unit 23 and housing 24 form an inward circulation passage and an outward circulation passage. The inward and outward circulation fans 21, 22 of the heat exchange device 2 are located on two different sides of the heat exchange unit 23, respectively. Hot air in the closed electrical apparatus A enters the heat exchange unit 23 disposed in the heat exchange device 2 through the inward circulation fan 21 and inward circulation air inlet 241 along a direction $I_1$, performing heat exchange. Cooled air leaves the heat exchange device 2 through the inward circulation air outlet 242 along a direction $I_2$ and returns to the inside of the closed electrical apparatus A. Cold air outside the closed electrical apparatus A enters the heat exchange unit 23 disposed in the heat exchange device 2 through the outward circulation fan 22 and an outward circulation air inlet 244 along a direction $O_2$, performing the heat exchange. Heated air leaves the heat exchange device 2 through an outward circulation air outlet 243 along a direction $O_1$ and is dissipated to the exterior of the heat exchange device 2.

As shown in FIG. 3B, the volume of the heat exchange device 2 must correspond to that of the closed electrical apparatus A, and a thickness $D_1$ thereof is confined by a space provided by the closed electrical apparatus A. To maintain a specific heat-dissipation level, the inward circulation fan 21 with a large diameter is employed. In order to not be limited to the thickness $D_1$, the inward circulation air inlet 241 is formed from a sloped surface and a width $D_2$ thereof is larger than the thickness $D_1$. Similarly, the outward circulation fan 22 with a large diameter is employed. The outward circulation air inlet 244 is also formed from a sloped surface and a width $D_3$ thereof is larger than the thickness $D_1$. Preferably, the inward and outward circulation fans 21, 22 shown in FIGS. 3A and 3C are axial fans and the invention is not limited thereto.

As shown in FIG. 2, a direction of inward circulation is denoted as $I_1$ toward $I_2$ and a direction of outward circulation is denoted as $O_2$ toward $O_1$. In a practical application, disposition of the circulation fans, configuration of fan blades, or a rotating direction of the circulation fans may be changed, enabling the direction of inward circulation to be changed to $I_2$ toward $I_1$ or enabling the direction of outward circulation to be changed to $O_1$ toward $O_2$. Change of the disposition of the circulation fans, change of the rotating direction of the circulation fans, or change of the airflow direction does not deviate from the spirit of the invention.

Figure 4A:
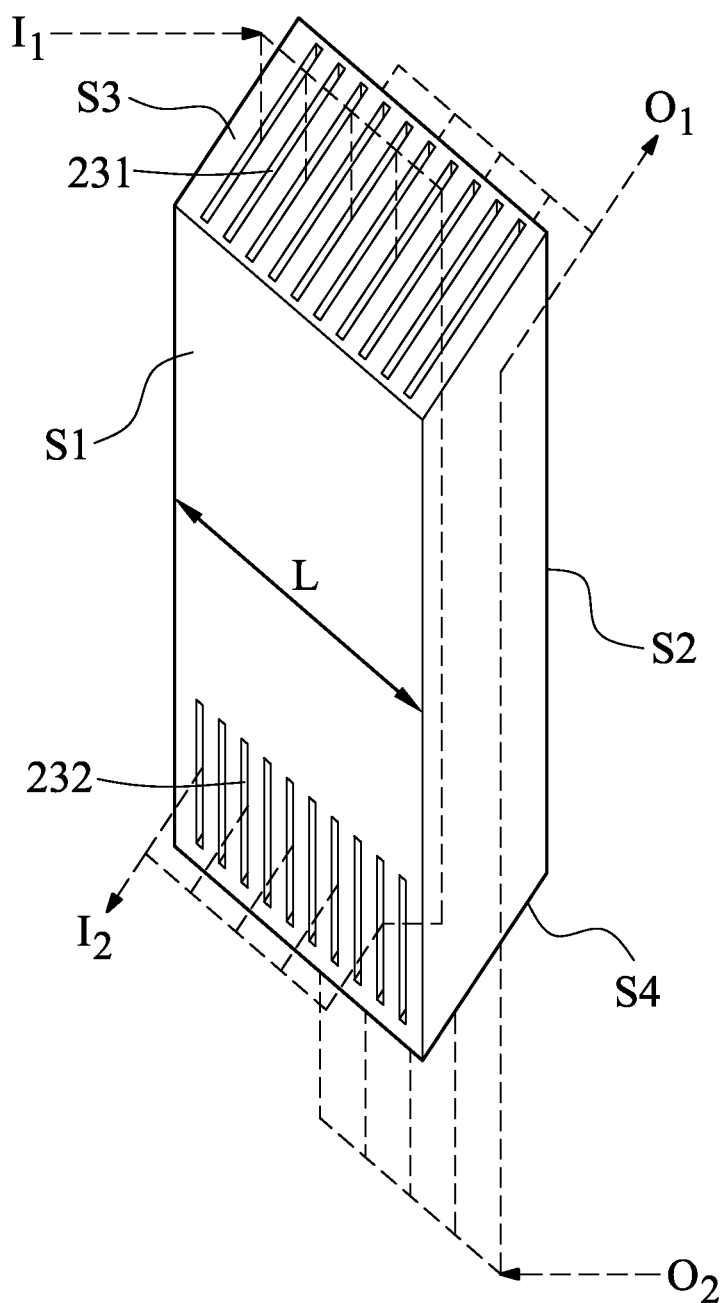
FIG. 4A and FIG. 4B show a heat exchange unit of the heat exchange device of the first embodiment of the invention at different view angles.
Figure 4B:
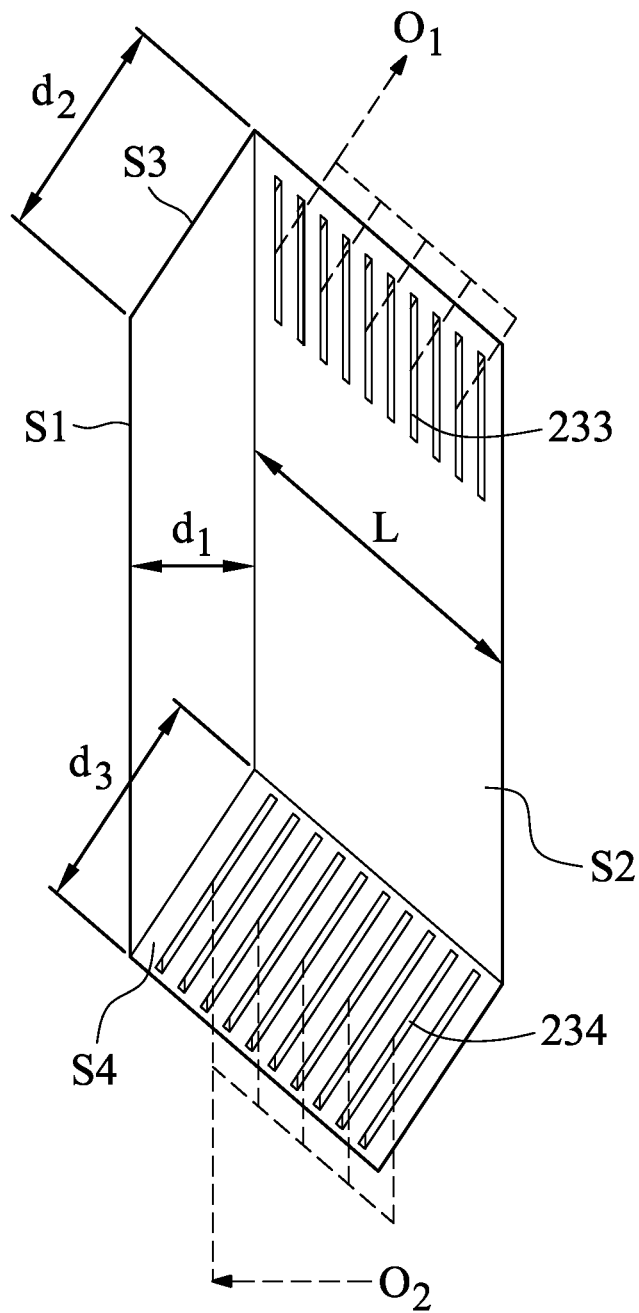

FIGS. 4A and 4B show the heat exchange unit 23 of the heat exchange device 2 of the first embodiment of the invention at different view angles. The heat exchange unit 23 further comprises a first vertical outer surface S1, a second vertical outer surface S2, a first sloped outer surface S3 and a second sloped outer surface S4. The first vertical outer surface S1 is parallel to the second vertical outer surface S2. The first sloped outer surface S3 connects the first vertical outer surface S1 to the second vertical outer surface S2. The second sloped outer surface S4 is parallel to the first sloped outer surface S3 and connects the first vertical outer surface S1 to the second vertical outer surface S2. As shown in FIGS. 3B, 4A, and 4B, the heat exchange unit 23 is substantially composed of metal, with a thickness d1 corresponding to the thickness $D_1$ of the housing 24. A width $d_2$ of a plane formed by an inward circulation air inlet 231 corresponds to the width $D_2$ of the inward circulation air inlet 241, and the inward circulation air inlet 231 is formed from the first sloped outer surface S3. A width $d_3$ of a plane formed by an outward circulation air inlet 234 corresponds to the width $D_3$ of the outward circulation air inlet 244, and the outward circulation air inlet 234 is formed from the second sloped outer surface S4. The length of the heat exchange unit 23 is denoted as L. Air flows within the heat exchange unit 23, and the cross-sectional area of heat exchange is $d_1 \times L$. The area of the inward circulation air inlet 231 is $d_2 \times L$, and the area of the outward circulation air inlet 234 is $d_3 \times L$. As the width $d_2$ of the inward circulation air inlet 231 and the width $d_3$ of the outward circulation air inlet 234 are larger than the thickness $d_1$ of the heat exchange unit 23, respectively, so that the ratio of the area of the air inlet to the cross-sectional area is larger than 1. The ratios of the areas of the air inlet and air outlet of the heat exchange unit 23 to the cross-sectional area are larger than 1, respectively, so that the heat-exchange efficiency can be enhanced. The cross-sectional area is the area of the cross-section perpendicular to the flow direction of the air flow.

Figure 5:
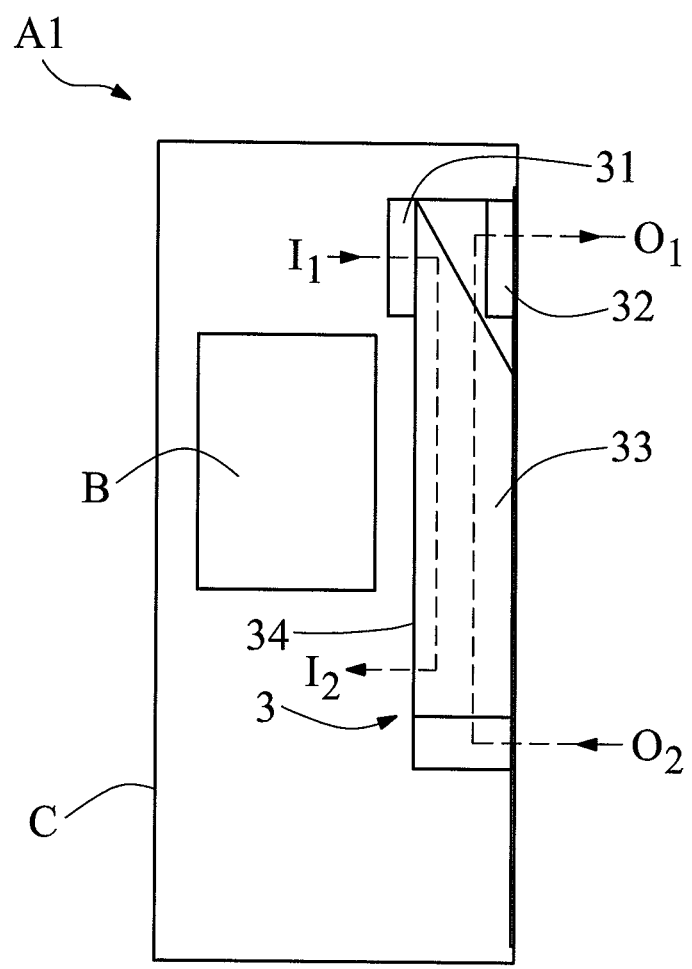
FIG. 5 is a cross-sectional side view of a heat exchange device, of a second embodiment of the invention, employed in a closed electrical apparatus.

FIG. 5 is a cross-sectional side view of a heat exchange device 3, of a second embodiment of the invention, employed in a closed electrical apparatus A1. The closed electrical apparatus A1 includes an electronic assembly B and a casing C. The heat exchange device 3 is disposed in the casing C and includes an inward circulation fan 31, an outward circulation fan 32, a heat exchange unit 33, and a housing 34. Unlike the heat exchange device 2 shown in FIG. 2, the inward and outward circulation fans 31, 32 of the heat exchange device 3 shown in FIG. 5 are located on the same sides of the heat exchange unit 33. Additionally, the inward circulation fan 31 is attached to the housing 34 and is disposed in the casing C.

Figure 6A:
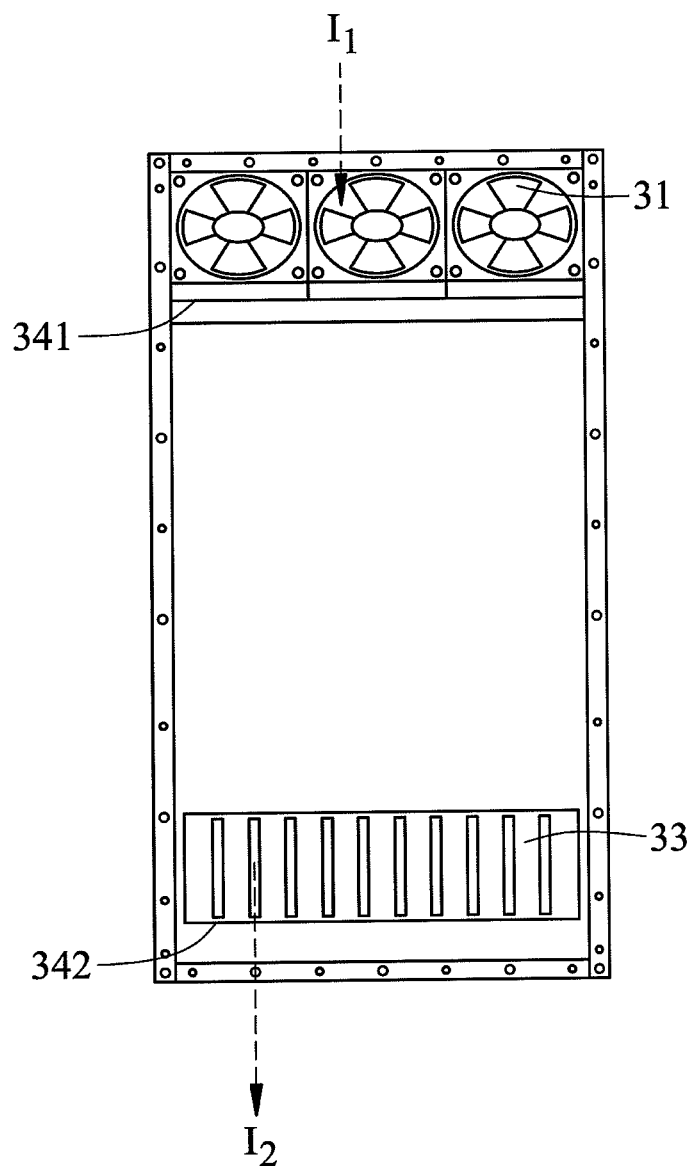
FIG. 6A is a schematic front view of the heat exchange device of the second embodiment of the invention.
Figure 6B:
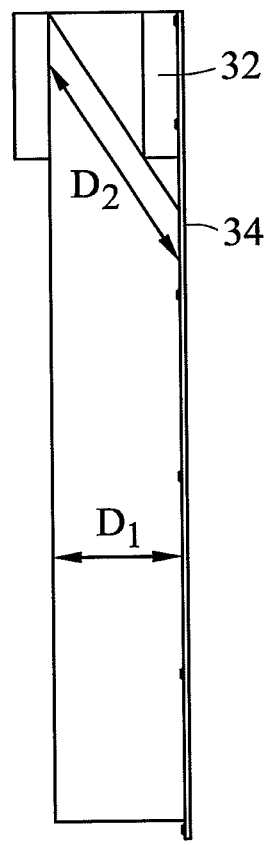
FIG. 6B is a schematic side view of the heat exchange device of the second embodiment of the invention.
Figure 6C:
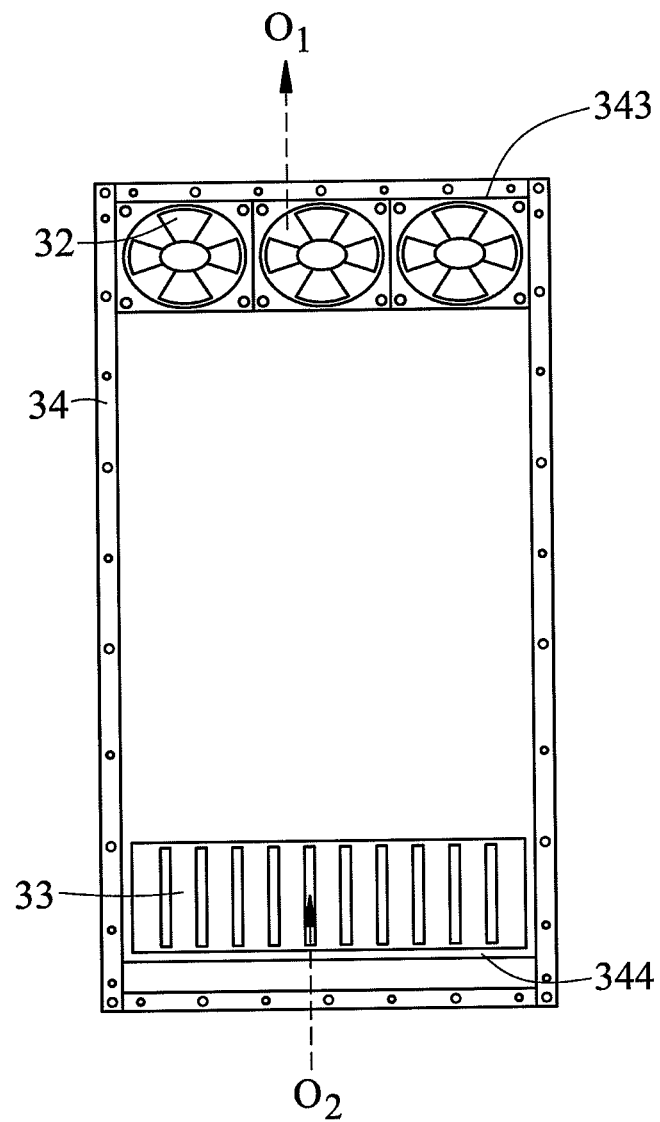
FIG. 6C is a schematic rear view of the heat exchange device of the second embodiment of the invention.

FIGS. 6A, 6B, and 6C are respectively the front, side, and rear views of the heat exchange device 3 of the second embodiment of the invention. As shown in FIGS. 5, 6A, 6B, and 6C, the housing 34 includes an inward circulation air inlet 341 and an inward circulation air outlet 342, both facing the inside of the casing C. Additionally, the housing 34 includes an outward circulation air inlet 344 and an outward circulation air outlet 343, both facing the outside of the casing C. The heat exchange unit 33 is disposed in the housing 34. The heat exchange unit 33 and housing 34 form an inward circulation passage and an outward circulation passage. Hot air in the closed electrical apparatus A1 enters the heat exchange unit 33 disposed in the heat exchange device 3 through the inward circulation fan 31 and inward circulation air inlet 341 along the direction $I_1$, performing the heat exchange. Cooled air leaves the heat exchange device 3 through the inward circulation air outlet 342 along the direction $I_2$ and returns to the inside of the closed electrical apparatus A1. Cold air outside the closed electrical apparatus A1 enters the heat exchange unit 33 disposed in the heat exchange device 3 through the outward circulation air inlet 344 along the direction $O_2$, performing the heat exchange. Heated air leaves the heat exchange device 3 through an outward circulation air outlet 343 along the direction $O_1$ and is dissipated to the exterior of the heat exchange device 3.

As shown in FIG. 6B, the volume of the heat exchange device 3 must correspond to that of the closed electrical apparatus A1, and the thickness $D_1$ thereof is confined by a space provided by the closed electrical apparatus A1. To maintain a specific heat-dissipation level, the outward circulation fan 32 with a large diameter is employed. In order to not be limited to the thickness $D_1$, the outward circulation air outlet 343 is formed from a sloped surface and the width $D_2$ thereof is larger than the thickness $D_1$ for receiving the outward circulation fan 32.

As shown in FIG. 5, the direction of inward circulation is denoted as $I_1$ toward $I_2$ and the direction of outward circulation is denoted as $O_2$ toward $O_1$. In a practical application, the configuration of fan blades or the rotating direction of the circulation fans may be changed, enabling the direction of inward circulation to be changed to $I_2$ toward $I_1$ or enabling the direction of outward circulation to be changed to $O_1$ toward $O_2$. The change of the disposition of the circulation fans, the change of the rotating direction of the circulation fans, or the change of the airflow direction does not deviate from the spirit of the invention.

Figure 7A:
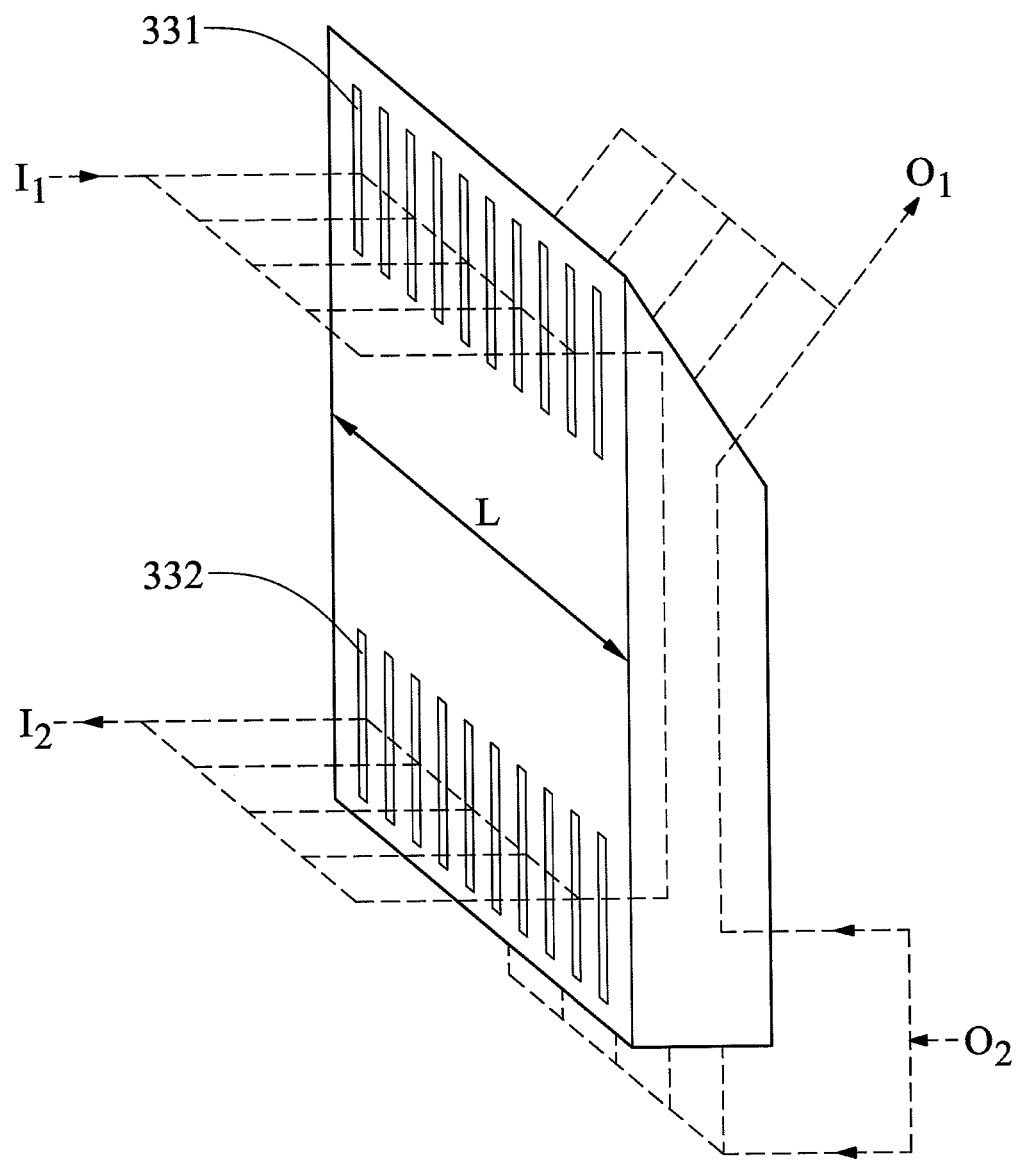
FIG. 7A and FIG. 7B show a heat exchange unit of the heat exchange device of the second embodiment of the invention at different view angles.
Figure 7B:
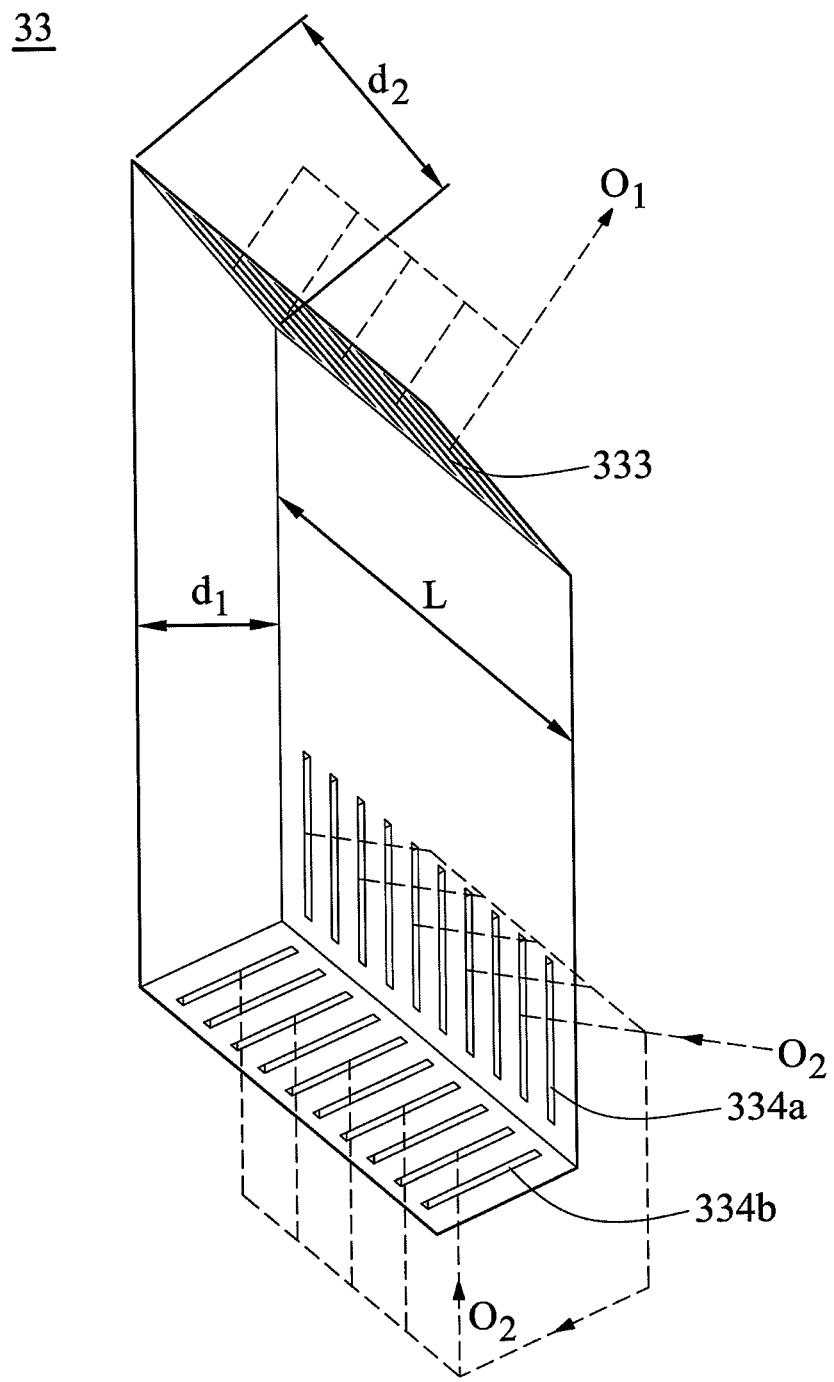

FIG. 7A and FIG. 7B show the heat exchange unit 33 of the heat exchange device 3 of the second embodiment of the invention at different view angles. As shown in FIGS. 6B, 7A, and 7B, the heat exchange unit 33 is substantially composed of metal, with the thickness $d_1$ corresponding to the thickness $D_1$ of the housing 34. The width $d_2$ of a plane formed by an outward circulation air outlet 333 of the heat exchange unit 33 corresponds to the width $D_2$ of the outward circulation air outlet 343 of the heat exchange unit 33, and the outward circulation air outlet 333 is formed from a sloped surface for increasing an outflow area. Moreover, to increase the outflow area, the heat exchange unit 33 further includes an outward circulation air inlet 334a and an outward circulation air inlet 334b. The outward circulation air inlets 334a, 334b respectively correspond to a side edge and a bottom edge of the outward circulation air inlet 344 of the housing 34 and are located on different planes. Accordingly, an inflow area formed by the outward circulation air inlets 334a, 334b is greater than the cross-sectional area through which the air flows within the heat exchange unit 33, thus enhancing airflow-exchange efficiency.

The heat exchange units 23 and 33 shown in FIGS. 4A, 4B, 7A, and 7B are composed of a plurality of inward circulation interval layers and a plurality of outward circulation interval layers. The inward circulation interval layers and outward circulation interval layers are alternately arranged. Namely, a passage formed by the inward circulation air inlet 231 and an inward circulation air outlet 232 of the heat exchange unit 23 and a passage formed by the outward circulation air inlet 234 and an outward circulation air outlet 233 of the heat exchange unit 23 are alternately arranged and do not connect to each other. A passage formed by an inward circulation air inlet 331 and an inward circulation air outlet 332 of the heat exchange unit 33 and a passage formed by the outward circulation air inlets 334a, 334b and the outward circulation air outlet 333 are alternately arranged and do not connect to each other. The passages are separated from each other by heat-dissipation plates composed of aluminum, copper, or a material with high thermal conductivity. In a practical application, an airflow direction of the heat exchange units 23 and 33 depends on an airflow direction generated by the correspondingly employed circulation fans and the invention is not limited thereto, as long as air exchange does not occur between the inward circulation and the outward circulation of the heat exchange units 23 and 33

In conclusion, according to the disclosed heat exchange device and heat exchange unit thereof, the air exchange does not occur between the inward circulation and the outward circulation and the area formed by at least one air inlet/air outlet is larger than the cross-sectional area of the air exchange, effectively reducing the size of the heat exchange device under the same heat-dissipation performance. Furthermore, as the at least one air inlet/air outlet of the disclosed heat exchange unit is formed from the sloped surface, the area of the at least one air inlet/air outlet is reduced with reduction of the size of the heat exchange unit. Thus, fans with a larger size can be employed to maintain the heat-dissipation efficiency, or the space required by heat dissipation of the heat exchange device can be reduced under the condition where the same heat-dissipation efficiency is provided.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat exchange unit comprising:
a first vertical outer surface and a second vertical outer surface, wherein the first vertical outer surface is parallel to the second vertical outer surface;
a sloped outer surface, connecting the first vertical outer surface to the second vertical outer surface;
a horizontal outer surface, connecting the first vertical outer surface to the second vertical outer surface;
a first air opening and a second air opening, wherein the first and second air openings form a first passage; and
a third air opening and a fourth air opening, wherein the third and fourth air openings form a second passage,
wherein, the first and second passages are alternately arranged and are separated from each other by at least one heat-dissipation plate, and the first air opening is disposed on the first vertical outer surface, and the second air opening is disposed on the first vertical outer surface,
wherein, the third air opening is disposed on the sloped outer surface, and the fourth air opening is disposed on the horizontal outer surface,
wherein a first fan is directly attached to the first vertical outer surface corresponding to the first air openings.

2. A heat exchange unit comprising:
a first vertical outer surface and a second vertical outer surface, wherein the first vertical outer surface is parallel to the second vertical outer surface;
a sloped outer surface, connecting the first vertical outer surface to the second vertical outer surface;
a horizontal outer surface, connecting the first vertical outer surface to the second vertical outer surface;
a first air inlet and a first air outlet;
a first passage disposed between the first air inlet and the first air outlet, wherein the first air inlet is disposed on the first vertical outer surface, wherein the first air outlet is disposed on the first vertical outer surface, wherein a first fan is attached to a housing and covers the first air inlet, wherein the fan is directly attached to the first vertical outer surface,
a second air inlet and a second air outlet; and
a second passage disposed between the second air inlet and the second air outlet, wherein the first and second passages are alternately arranged and are separated from each other, wherein the second air inlet is disposed on the horizontal outer surface, the second air outlet is disposed on the sloped outer surface.

3. The heat exchange unit as claimed in claim 2, wherein the first and second passages are separated from each other by at least one heat-dissipation plate.

4. A heat exchange device, comprising:
a housing;
a first fan disposed in the housing;
a second fan disposed in the housing; and
a heat exchange unit disposed in the housing and comprising:
a first vertical outer surface and a second vertical outer surface, wherein the first vertical outer surface is parallel to the second vertical outer surface;
a sloped outer surface, connecting the first vertical outer surface to the second vertical outer surface;
a horizontal outer surface, connecting the first vertical outer surface to the second vertical outer surface; and
a first air inlet and a second air inlet,
wherein the first air inlet is formed from the first vertical outer surface with respect to the housing, wherein the second air inlet is formed on the horizontal outer surface with respect to the housing,
wherein the first fan is directly attached to the first vertical outer surface,
wherein the second fan is directly attached to the housing.

5. The heat exchange device as claimed in claim 4, further comprising two passages respectively formed by the first and second air inlets, and the two passages are alternately arranged and are separated from each other.

6. The heat exchange device as claimed in claim 5, wherein the two passages are separated from each other by a heat-dissipation plate.

7. A heat exchange device, comprising:
a housing;
an inward circulation fan disposed in the housing;
an outward circulation fan disposed in the housing; and
a heat exchange unit disposed in the housing and comprising:
a first vertical outer surface and a second vertical outer surface, wherein the first vertical outer surface is parallel to the second vertical outer surface;
a sloped outer surface, connecting the first vertical outer surface to the second vertical outer surface;
a horizontal outer surface, connecting the first vertical outer surface to the second vertical outer surface; and
a first air inlet and a second air inlet,
wherein the inward circulation fan is correspondingly disposed at the first air inlet, the outward circulation fan is parallel to the inward circulation fan, and the first air inlet is formed from the first vertical outer surface, wherein the second air inlet is formed on the horizontal outer surface,
wherein the inward circulation fan is directly attached to the first vertical outer surface,
wherein the outward circulation fan is directly attached to the housing.

8. The heat exchange device as claimed in claim 7, further comprising two passages respectively formed by the first and second air inlets, and the two passages are alternately arranged and are separated from each other.

9. The heat exchange device as claimed in claim 8, wherein the two passages are separated from each other by a heat-dissipation plate.

* * * * *